(12) United States Patent
Ogawa et al.

(10) Patent No.: US 11,081,183 B2
(45) Date of Patent: Aug. 3, 2021

(54) MEMORY SYSTEM AND CONTROL METHOD OF MEMORY SYSTEM FOR CONTROLLING OF FIRST AND SECOND WRITING OPERATIONS

(71) Applicant: Kioxia Corporation, Minato-ku (JP)

(72) Inventors: Masahiro Ogawa, Odawara (JP); Norio Aoyama, Machida (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/815,073

(22) Filed: Mar. 11, 2020

(65) Prior Publication Data
US 2021/0082513 A1   Mar. 18, 2021

(30) Foreign Application Priority Data
Sep. 17, 2019   (JP) .............................. JP2019-168652

(51) Int. Cl.
| | | |
|---|---|---|
| G11C 7/22 | (2006.01) | |
| G11C 16/10 | (2006.01) | |
| G11C 16/04 | (2006.01) | |
| G11C 16/14 | (2006.01) | |
| G06F 3/06 | (2006.01) | |
| G11C 11/56 | (2006.01) | |
| G11C 7/10 | (2006.01) | |
| G06F 13/16 | (2006.01) | |

(52) U.S. Cl.
CPC ............ *G11C 16/10* (2013.01); *G06F 3/0604* (2013.01); *G06F 3/0659* (2013.01); *G06F 3/0679* (2013.01); *G06F 13/16* (2013.01); *G11C 7/10* (2013.01); *G11C 7/1063* (2013.01); *G11C 7/22* (2013.01); *G11C 11/5671* (2013.01); *G11C 16/0483* (2013.01); *G11C 16/14* (2013.01)

(58) Field of Classification Search
CPC ......... G11C 16/10; G11C 7/22; G11C 7/1063; G11C 7/10; G11C 11/5671; G11C 16/0483; G11C 16/14; G06F 13/16; G06F 3/0604; G06F 3/0659; G06F 3/0679
See application file for complete search history.

(56) References Cited

U.S. PATENT DOCUMENTS

| | | |
|---|---|---|
| 7,848,144 B2 | 12/2010 | Lasser |
| 9,076,516 B2 | 7/2015 | Nam et al. |

(Continued)

FOREIGN PATENT DOCUMENTS

| | | |
|---|---|---|
| JP | 2011-524600 A | 9/2011 |

*Primary Examiner* — Mushfique Siddique
(74) *Attorney, Agent, or Firm* — Oblon, McClelland, Maier & Neustadt, L.L.P.

(57) ABSTRACT

According to one embodiment, a memory system includes a semiconductor memory device including a first and second string each including cells coupled in series, and a memory controller configured to instruct the device to execute a write operation for writing data on any one of the cells in the first or second string. The first and second string are coupled in parallel between a bit line and a source line, and coupled to different word lines. The write operation includes a first write operation and a second write operation executed after the first write operation. The controller is configured to instruct the device to execute a first write operation on a second cell in the second string between a first write operation on a first cell in the first string and a second write operation on the first cell.

16 Claims, 11 Drawing Sheets

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2018/0081414 A1* | 3/2018 | Kojima ............... G06F 11/2015 |
| 2018/0102177 A1 | 4/2018 | Wu et al. |
| 2019/0088313 A1* | 3/2019 | Kondo ................ G11C 11/5642 |
| 2019/0267090 A1* | 8/2019 | Wang ................. G11C 16/0483 |
| 2019/0287642 A1* | 9/2019 | Nishida .............. G11C 16/0483 |
| 2020/0043549 A1* | 2/2020 | Shibata ................ G11C 11/565 |
| 2020/0075106 A1* | 3/2020 | Tokutomi ............ G11C 11/5642 |
| 2020/0161320 A1* | 5/2020 | Yamaguchi ............ G11C 16/26 |

\* cited by examiner

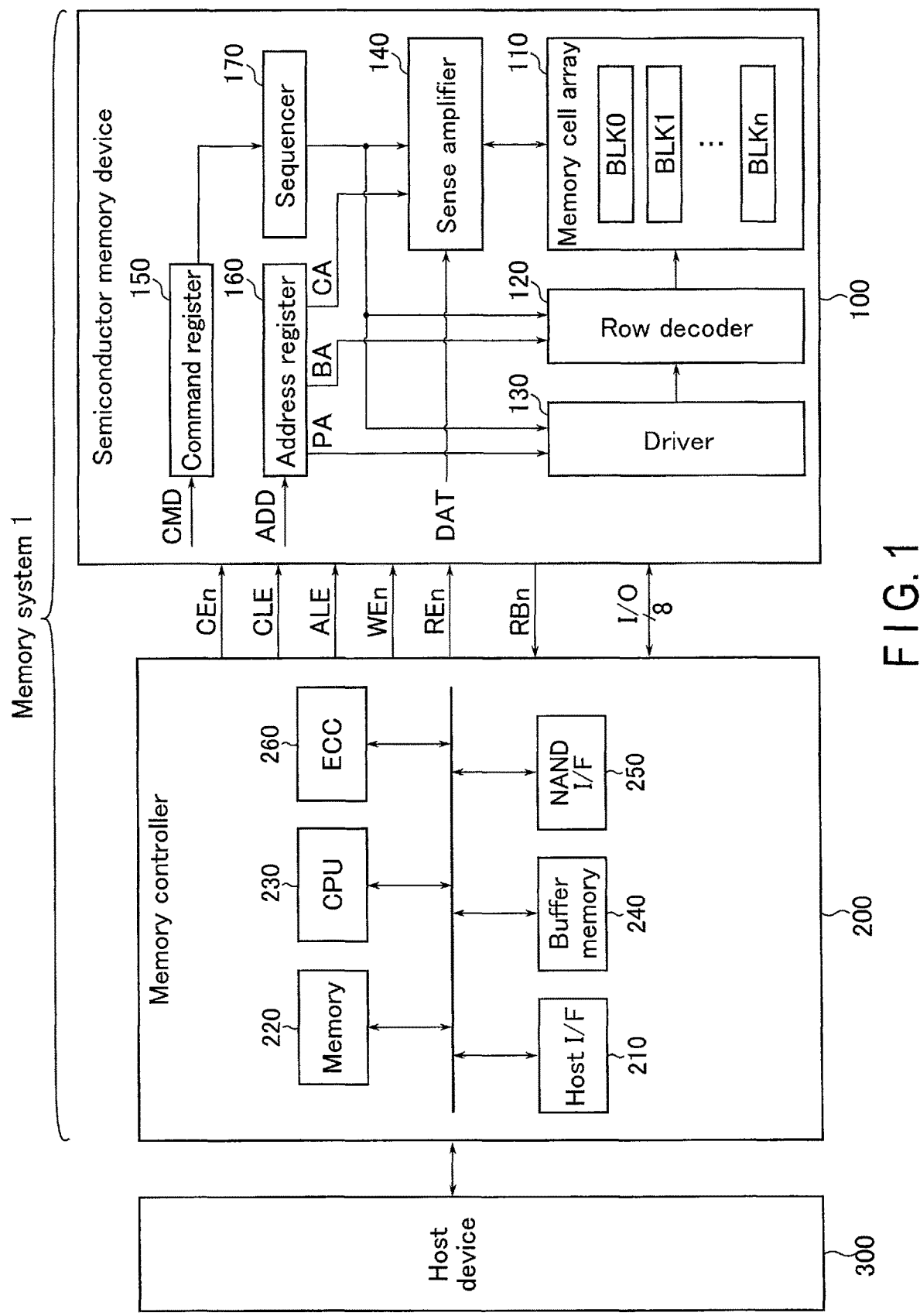
F I G. 1

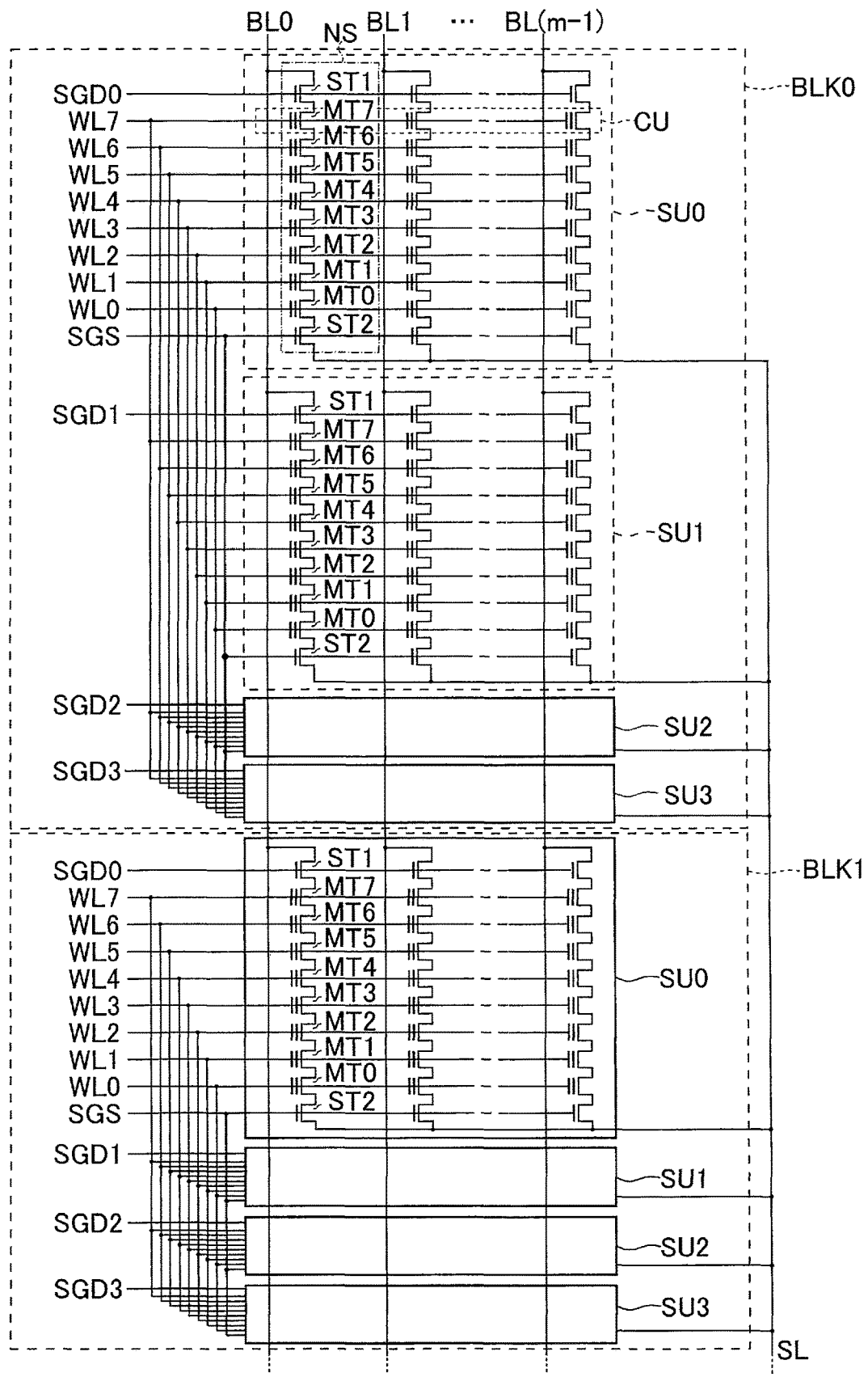
F I G. 2

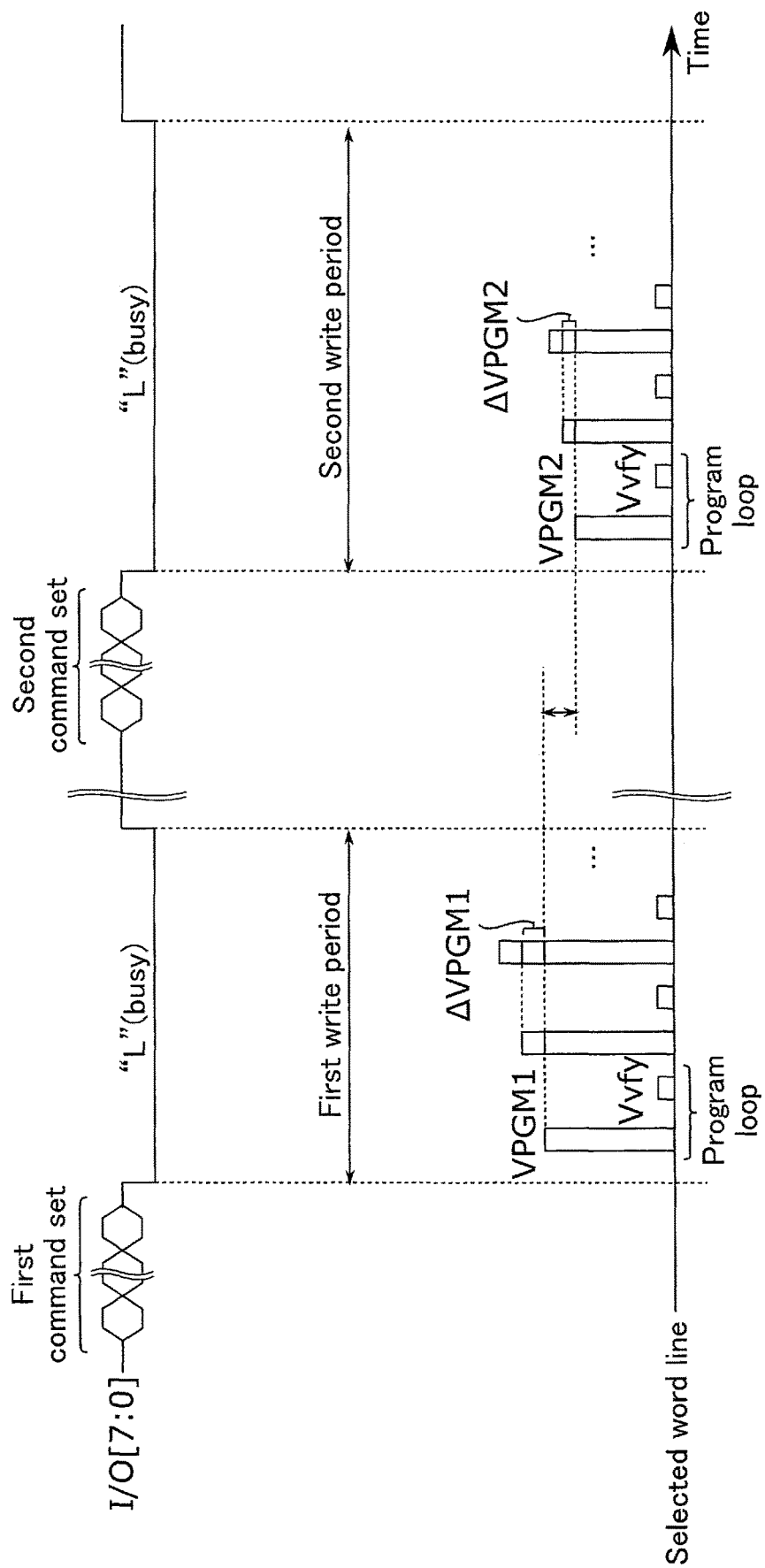
F I G. 8

|       |     |      | SU0 | SU1 | SU2 | SU3 |
|-------|-----|------|-----|-----|-----|-----|
| BLK1  |     | ...  |     |     |     |     |
|       | WL1 | WRT2 |     |     |     |     |
|       |     | WRT1 | 69  | 71  | 73  | 75  |
|       | WL0 | WRT2 | 70  | 72  | 74  | 76  |
|       |     | WRT1 | 61  | 63  | 65  | 67  |
| BLK0  | WL7 | WRT2 | 62  | 64  | 66  | 68  |
|       |     | WRT1 | 53  | 55  | 57  | 59  |
|       | WL6 | WRT2 | 54  | 56  | 58  | 60  |
|       |     | WRT1 | 45  | 47  | 49  | 51  |
|       | WL5 | WRT2 | 46  | 48  | 50  | 52  |
|       |     | WRT1 | 37  | 39  | 41  | 43  |
|       | WL4 | WRT2 | 38  | 40  | 42  | 44  |
|       |     | WRT1 | 29  | 31  | 33  | 35  |
|       | WL3 | WRT2 | 30  | 32  | 34  | 36  |
|       |     | WRT1 | 21  | 23  | 25  | 27  |
|       | WL2 | WRT2 | 22  | 24  | 26  | 28  |
|       |     | WRT1 | 13  | 15  | 17  | 19  |
|       | WL1 | WRT2 | 14  | 16  | 18  | 20  |
|       |     | WRT1 | 5   | 7   | 9   | 11  |
|       | WL0 | WRT2 | 6   | 8   | 10  | 12  |
|       |     | WRT1 | 1   | 2   | 3   | 4   |

FIG. 9

|  |  |  | SU0 | SU1 | SU2 | SU3 |
|---|---|---|---|---|---|---|
| BLK1 |  | ... |  |  |  |  |
|  | WL1 | WRT2 |  |  |  |  |
|  |  | WRT1 | 69 | 71 | 73 | 75 |
|  | WL0 | WRT2 | 70 | 72 | 74 | 76 |
|  |  | WRT1 | 65 | 66 | 67 | 68 |
| BLK0 | WL7 | WRT2 | 61 | 62 | 63 | 64 |
|  |  | WRT1 | 53 | 55 | 57 | 59 |
|  | WL6 | WRT2 | 54 | 56 | 58 | 60 |
|  |  | WRT1 | 45 | 47 | 49 | 51 |
|  | WL5 | WRT2 | 46 | 48 | 50 | 52 |
|  |  | WRT1 | 37 | 39 | 41 | 43 |
|  | WL4 | WRT2 | 38 | 40 | 42 | 44 |
|  |  | WRT1 | 29 | 31 | 33 | 35 |
|  | WL3 | WRT2 | 30 | 32 | 34 | 36 |
|  |  | WRT1 | 21 | 23 | 25 | 27 |
|  | WL2 | WRT2 | 22 | 24 | 26 | 28 |
|  |  | WRT1 | 13 | 15 | 17 | 19 |
|  | WL1 | WRT2 | 14 | 16 | 18 | 20 |
|  |  | WRT1 | 5 | 7 | 9 | 11 |
|  | WL0 | WRT2 | 6 | 8 | 10 | 12 |
|  |  | WRT1 | 1 | 2 | 3 | 4 |

FIG. 11

MEMORY SYSTEM AND CONTROL METHOD OF MEMORY SYSTEM FOR CONTROLLING OF FIRST AND SECOND WRITING OPERATIONS

CROSS-REFERENCE TO RELATED APPLICATIONS

This application is based upon and claims the benefit of priority from Japanese Patent Application No. 2019-168652, filed Sep. 17, 2019, the entire contents of which are incorporated herein by reference.

FIELD

Embodiments described herein relate generally to a memory system and control method of memory device and control method of memory device.

BACKGROUND

A NAND flash memory is known as a semiconductor memory device capable of storing data in a non-volatile manner. In the semiconductor memory device such as the NAND flash memory, multi-bit data may be stored in a single storage element for high integration and large storage capacity. Various techniques for writing data on the storage element capable of storing multi-bit data have been proposed. The various techniques include a control of an order of data writing to a plurality of the storage elements.

BRIEF DESCRIPTION OF THE DRAWINGS

FIG. 1 is a block diagram for illustrating a memory system according to an embodiment;

FIG. 2 is a circuit diagram for illustrating a configuration of a memory cell array of a semiconductor memory device in the embodiment;

FIG. 8 is a timing chart for illustrating a relation between the first write operation and the second write operation of the memory system according to the embodiment;

FIG. 9 is a conceptual diagram for illustrating an order of executing the first write operation and the second write operation of the memory system according to the embodiment;

FIG. 11 is a conceptual diagram for illustrating an order of executing the first write operation and the second write operation of the memory system according to a comparative example.

DETAILED DESCRIPTION

Figure 3:
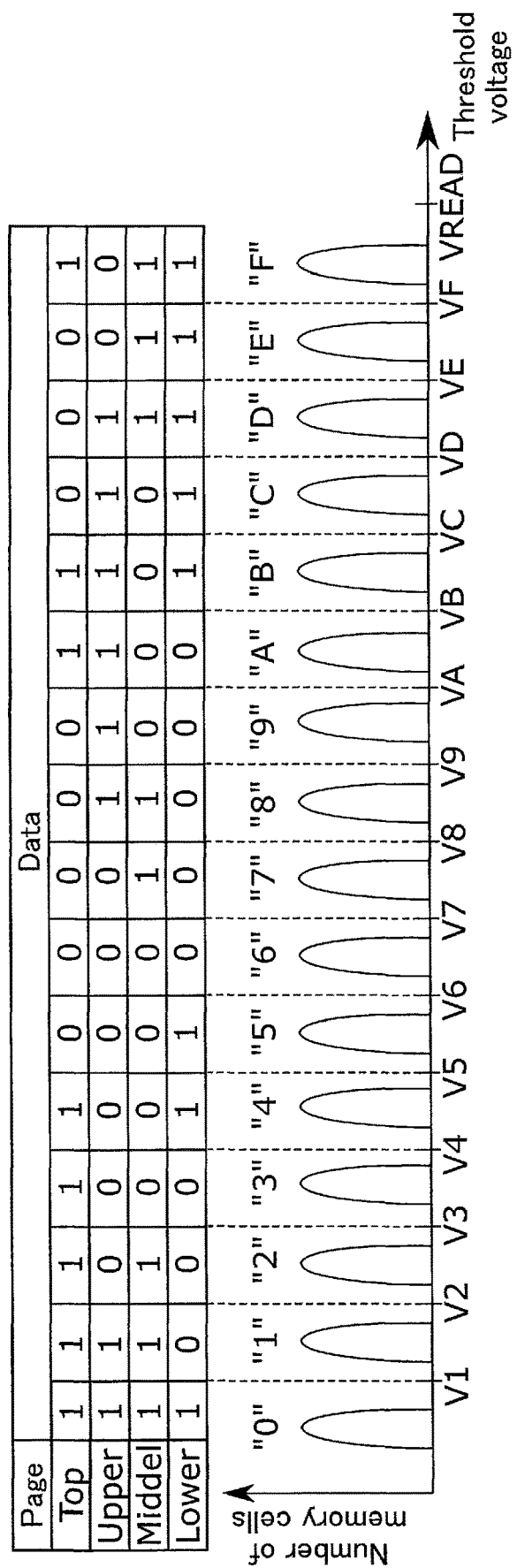
FIG. 3 is a schematic diagram for illustrating a threshold voltage distribution of memory cell transistors in the memory cell array in the embodiment.

In general, according to one embodiment, a memory system includes a semiconductor memory device and a memory controller. The semiconductor memory device includes a first memory string and a second memory string each including a plurality of memory cell transistors electrically coupled in series. The memory controller is configured to instruct the semiconductor memory device to execute a write operation for writing data on any one of the memory cell transistors in the first memory string or in the second memory string. The first memory string and the second memory string are electrically coupled in parallel between a bit line and a source line, and electrically coupled to different word lines. The write operation includes a first write operation and a second write operation executed after the first write operation. The memory controller is configured to instruct the semiconductor memory device to execute a first write operation on a second memory cell transistor in the second memory string between a first write operation on a first memory cell transistor in the first memory string and a second write operation on the first memory cell transistor.

Hereinafter, embodiments will be described with reference to the drawings. In the description, constituent elements having substantially the same function and configuration will be assigned with the same reference numeral. Each of the embodiments described below merely indicates an exemplary apparatus or method for embodying the technical idea of the embodiment. The structural elements' materials, shapes, structures, arrangements, etc. of the technical ideas of the embodiments are not limited to the ones described below. A technical idea of the embodiment may be modified in various manners in the claims.

1. Embodiment

A semiconductor memory device according to an embodiment will be described. Hereinafter, a NAND flash memory, in which memory cell transistors are three-dimensionally stacked above a semiconductor substrate, will be described as an example of the semiconductor memory device.

1.1 Configuration

1.1.1 Configuration of Memory System

First, an overall configuration of a memory system 1 will be described with reference to FIG. 1. In the example of FIG. 1, some of the couplings between the element blocks are indicated by arrows; however, the couplings between the element blocks are not limited to those shown in FIG. 1.

As shown in FIG. 1, the memory system 1 includes a semiconductor memory device 100 and a memory controller 200, and may be coupled to an external host device 300. The memory controller 200 and the semiconductor memory device 100 may form one semiconductor device in combination, an example of which includes a memory card such as an SD™ card, a universal flash storage (UFS), or a solid state drive (SSD).

The memory controller 200 instructs the semiconductor memory device 100 to read, write, and erase data in response to an instruction sent from the host device 300. The memory controller 200 manages the memory space of the semiconductor memory device 100.

The memory controller 200 includes a host interface circuit 210, a memory (RAM) 220, a processor (CPU) 230, a buffer memory 240, a NAND interface circuit 250, and an ECC circuit 260.

The host interface circuit 210 is capable of connecting to the host device 300 by a host bus, and manages communications with the host device 300. For example, the host interface circuit 210 transfers an instruction and data received from the host device 300 to the processor 230 and buffer memory 240, respectively. In response to an instruction of the processor 230, the host interface 210 transfers data in the buffer memory 240 to the host device 300.

The memory 220 is, for example, a semiconductor memory, such as a DRAM, and stores firmware for controlling the semiconductor memory device 100, various management tables, and the like. The memory 220 is used as a work area of the processor 230.

The processor 230 controls the operation of the entire memory controller 200. For example, in response to a write instruction received from the host device 300, the processor 230 issues a write command to the NAND interface circuit 250. A similar operation is performed in the read operation or erase operation. The processor 230 executes various types of processing to manage the memory space of the semiconductor memory device 100, such as wear leveling, etc.

The buffer memory 240 temporarily stores read data received from the semiconductor memory device 100 and write data received from the host device 300 by the memory controller 200.

The NAND interface circuit 250 is coupled to the semiconductor memory device 100 via a NAND bus, and manages communications with the semiconductor memory device 100.

The ECC circuit 260 executes error correction (error check and correction (ECC)) processing on data. Specifically, the ECC circuit 260 generates parity based on write data in the data write operation. In the data read operation, the ECC circuit 260 generates a syndrome from the parity to detect an error, and corrects the error.

Signals transmitted and received between the semiconductor memory device 100 and the memory controller 200 are based on the NAND interface. For example, the NAND interface circuit 250 transmits, to the semiconductor memory device 100, a command latch enable signal CLE, an address latch enable signal ALE, a write enable signal WEn, and a read enable signal REn, based on the instructions received from the processor 230, receives a ready/busy signal RBn from the semiconductor memory device 100, and transmits and receives an input/output signal I/O to and from the semiconductor memory device 100.

The signals CLE and ALE notify the semiconductor memory device 100 that the input signal I/O to the semiconductor memory device 100 is a command CMD or address information ADD, respectively. Signal WEn is asserted at an "L" level, and is used for taking an input signal I/O in the semiconductor memory device 100. Signal REn is also asserted at the "L" level, and is used for reading out an output signal I/O from the semiconductor memory device 100.

The ready/busy signal RBn notifies whether the semiconductor memory device 100 can receive an instruction from the memory controller 200. The ready/busy signal RBn is brought to an "H" level when the semiconductor memory device 100 is in a ready state of being ready to receive a command from the memory controller 200, and to an "L" level when in a busy state of being unready to receive any command.

The input/output signal I/O may be an 8-bit signal, which may include command CMD, address information ADD, and data DAT. For example, in the write operation, the input/output signal I/O transferred to the semiconductor memory device 100 includes write command CMD issued by the processor 230, address information ADD, and write data DAT in the buffer memory 240. In the read operation, the input/output signal I/O transferred to the semiconductor memory device 100 includes read command CMD and address information ADD, and the input/output signal I/O transferred to the memory controller 200 includes read data DAT.

The host device 300 using the memory system 1 described above may be a digital camera, a personal computer, or the like.

Next, the configuration of the semiconductor memory device 100 will be described. The semiconductor memory device 100 includes a memory cell array 110, a row decoder 120, a driver circuit 130, a sense amplifier 140, a command register 150, an address register 160, and a sequencer 170.

The memory cell array 110 includes a plurality of blocks BLK0 to BLKn (where n is an integer equal to or greater than 1). The block BLK corresponds to a data erase unit, and is a set of nonvolatile memory cell transistors, each of which is associated with a bit line and a word line.

The row decoder 120 selects one of blocks BLK0 to BLKn based on block address BA stored in the address register 160. In addition, the row decoder 120 selects a row corresponding to a plurality of word lines in the selected block BLK, and applies a voltage supplied from the driver 130 to the selected word line.

The driver 130 generates a required voltage based on the instruction of the sequencer 170. The driver 130 supplies the generated voltage to the row decoder 120 based on page address PA stored in the address register 160.

In the read operation, the sense amplifier 140 senses the threshold voltages of memory cell transistors in the memory cell array 110, and outputs data read based on the sense result (read data) to the memory controller 200 via the input/output signal I/O. In the write operation, the sense amplifier 140 transmits, to the memory cell array 110, the write data received from the memory controller 200 via the input/output signal I/O. For example, the sense amplifier 140 includes a first latch circuit (not shown) that couples the input/output signal I/O interconnect and the memory cell array 110, and a plurality of second latch circuits (not shown) coupled in parallel to the first latch circuit with the memory cell array 110.

The command register 150 stores a command CMD received from the memory controller 200. The address register 160 stores address information ADD received from the memory controller 200. The address information ADD includes a column address CA, a page address PA, and a block address BA.

The sequencer 170 controls the operation of the entire semiconductor memory device 100 based on the command CMD stored in the command register 150. Specifically, the sequencer 170 controls the row decoder 120, the driver 130, the sense amplifier 140, etc., based on the command CMD, and executes a data write operation, read operation, etc.

1.1.2 Configuration of Memory Cell Array

Next, the configuration of the memory cell array 110 will be described with reference to FIG. 2. FIG. 2 illustrates two blocks, BLK0 and BLK1, and they have a similar configuration. The other blocks BLK also have a similar configuration to that of blocks BLK0 and BLK1, and illustration is omitted.

As shown in FIG. 2, each of blocks BLK0 and BLK1 includes, for example, four string units SU (SU0 to SU3). Each of the string units SU includes a plurality of NAND strings NS. Each NAND string NS includes, for example, eight memory cell transistors MT0 to MT7, and select transistors ST1 and ST2. Hereinafter, memory cell transistors MT0 to MT7 will be each referred to as memory cell transistor MT unless specified. The memory cell transistor MT includes a control gate and a charge storage layer, and stores electric charge (electron) corresponding to data in a non-volatile manner.

The number of string units SU is not limited to 4. The memory cell transistor MT may be of a MONOS type which uses an insulating film as the charge storage layer, or an FG type which uses a conductive film as the charge storage layer. In the present embodiment, a MONOS-type memory cell transistor will be described as an example. The number of memory cell transistors MT is not limited to 8, and may be, but not limited to, 16, 32, 64, 96, 128, etc. Moreover, the number of each of select transistors ST1 and ST2 is discretionary as long as one select transistor ST1 and one select transistor ST2 are included.

The memory cell transistors MT are coupled in series between the source of select transistor ST1 and the drain of select transistor ST2. More specifically, the current paths of memory cell transistors MT0 to MT7 are coupled in series. The drain of memory cell transistor MT7 is coupled to the source of select transistor ST1, and the source of memory cell transistor MT0 is coupled to the drain of select transistor ST2.

The gates of select transistors ST1 respectively included in string units SU0 to SU3 in the same block BLK are respectively coupled to select gate lines SGD0 to SGD3. Hereinafter, select gate lines SGD0 to SGD3 will each be referred to as select gate line SGD unless specified.

The gates of select transistors ST2 respectively included in string units SU0 to SU3 in the same block BLK are respectively coupled in common to select gate line SGS. Alternatively, the gates of select transistors ST1 respectively included in string units SU0 to SU3 may be respectively coupled to different select gate lines SGS0 to SGS3 (not shown).

The control gates of memory cell transistors MT0 to MT7 in the same block BLK are respectively coupled in common to word lines WL0 to WL7. Hereinafter, word lines WL0 to WL7 will be each referred to as word line WL or WLi (where i is an integer of 0 to 7).

Blocks BLK0 and BLK1 share the source line SL.

Select gate lines SGS and SGD0 to SGD3 and word lines WL0 to WL7 are represented by the same reference symbols/numerals in blocks BLK0 and BLK1, but they are different interconnects not electrically coupled to one another between the blocks BLK.

The drain of select transistor ST1 of each NAND string NS in a string unit SU is coupled to different bit lines BL0 to BL(m-1) (where m is an integer equal to or greater than 2). Hereinafter, bit lines BL0 to BL(m-1) will be each referred to as bit line BL unless specified. Each bit line BL is coupled in common to one NAND string NS in each string unit SU among the plurality of blocks BLK. NAND strings NS, each in a corresponding string unit SU, among the plurality of blocks BLK are coupled in parallel between a corresponding bit line BL and a source line SL. Moreover, the sources of the plurality of select transistors ST2 are coupled in common to the source line SL. That is, a string unit SU is a set of NAND strings NS coupled to different bit lines BL and coupled commonly to the same select gate lines SGD and SGS. A block BLK is a set of a plurality of string units SU sharing the word lines WL. The memory cell array 110 is a set of a plurality of blocks BLK sharing bit lines BL.

A write operation and a read operation are performed collectively on the memory cell transistor MT coupled to one of the word lines WL in one of string units SU. In the following description, a group of memory cell transistors MT collectively selected in the write operation and the read operations will be referred to as "cell unit CU". In one cell unit CU, a group of 1-bit data written in or read from each memory cell transistor MT will be referred to as a "page". Thus, if 4-bit data is stored in one memory cell transistor MT, 4-page data is stored in a cell unit CU coupled to one word line WL.

In the present embodiment, one memory cell transistor MT can store 4-bit data. Namely, the memory cell transistor MT in the present embodiment is a quad level cell (QLC) storing 4-bit data. The bits of 4-bit data stored in the quad level cell (QLC) memory cell transistor are called a lower bit, a middle bit, an upper bit, and a top bit, from the low-order bit. A set of lower bits stored in memory cell transistors MT coupled to the same word line WL is called a "lower page", a set of middle bits is called a "middle page", a set of upper bits is called an "upper page", and a set of top bits is called a "top page".

The memory cell array 110 may have other configurations. That is, a configuration of the memory cell array 110 is described in, for example, U.S. patent application Ser. No. 12/407,403 filed on Mar. 19, 2009, entitled "THREE DIMENSIONAL STACKED NONVOLATILE SEMICONDUCTOR MEMORY". It is also described in U.S. patent application Ser. No. 12/406,524 filed on Mar. 18, 2009, entitled "THREE DIMENSIONAL STACKED NON-VOLATILE SEMICONDUCTOR MEMORY"; U.S. patent application Ser. No. 12/679,991 filed on Mar. 25, 2010, entitled "NON-VOLATILE SEMICONDUCTOR STORAGE DEVICE AND METHOD OF MANUFACTURING THE SAME"; and U.S. patent application Ser. No. 12/532,030 filed on Mar. 23, 2009, entitled "SEMICONDUCTOR MEMORY AND METHOD FOR MANUFACTURING SAME". These patent applications are referred to throughout the specification of the present application.

1.2 Threshold Voltage Distributions of Memory Cell Transistors

Next, the threshold voltage distributions of the memory cell transistors MT will be described with reference to FIG. 3. FIG. 3 shows storable data, threshold voltage distributions, and voltages used in a read operation for memory cell transistors MT in the memory cell array 110.

As shown in FIG. 3, when the memory cell transistors MT store 4-bit data, the threshold voltage distribution thereof can be divided into sixteen. The sixteen threshold voltage distributions are called, in the ascending order of the threshold voltage, a "0" state, "1" state, "2" state, "3" state, "4" state, "5" state, "6" state, "7" state, "8" state, "9" state, "A" state, "B" state, "C" state, "D" state, "E" state, and "F" state.

Voltages V1, V2, V3, V4, V5, V6, V7, V8, V9, VA, VB, VC, VD, VE and VF shown in FIG. 3 are respectively used for a verification operation at the "0" state, "1" state, "2" state, "3" state, "4" state, "5" state, "6" state, "7" state, "8" state, "9" state, "A" state, "B" state, "C" state, "D" state, "E" state, and "F" state in a write operation. Voltage VREAD is a voltage applied to non-selected word lines in a read operation. When voltage VREAD is applied to a gate, a memory cell transistor MT is set to an ON state regardless of data stored therein. The relation among the voltages is V1<V2<V3<V4<V5<V6<V7<V8<V9<VA<VB<VC<VD<VE<VF<VREAD.

The "0" level of the above-described threshold voltage distributions corresponds to an erase state of the memory cell transistors MT. The threshold voltage belonging to the "0" state is lower than voltage V1. The threshold voltage belonging to the "1" state is equal to or higher than voltage V1 and lower than voltage V2. The threshold voltage belonging to the "2" state is equal to or higher than voltage V2 and lower than voltage V3. The threshold voltage belonging to the "3" state is equal to or higher than voltage V3 and lower than voltage V4. The threshold voltage belonging to the "4" state is equal to or higher than voltage V4 and lower than voltage V5. The threshold voltage belonging to the "5" state is equal to or higher than voltage V5 and lower than voltage V6. The threshold voltage belonging the "6" state is equal to or higher than voltage V6 and lower than voltage V7. The threshold voltage belonging to the "7" state is equal to or higher than voltage V7 and lower than voltage V8. The threshold voltage belonging to the "8" state is equal to or higher than voltage V8 and lower than voltage V9. The threshold voltage belonging to the "9" state is equal to or higher than voltage V9 and lower than voltage VA. The threshold voltage belonging to the "A" state is equal to or higher than voltage VA and lower than voltage VB. The threshold voltage belonging to the "B" state is equal to or higher than voltage VB and lower than voltage VC. The threshold voltage belonging to the "C" state is equal to or higher than voltage VC and lower than voltage VD. The threshold voltage belonging to the "D" state is equal to or higher than voltage VD and lower than voltage VE. The threshold voltage belonging to the "E" state is equal to or higher than voltage VE and lower than voltage VF. The threshold voltage belonging to the "F" state is equal to or higher than voltage VE and lower than voltage VREAD.

The above-described sixteen threshold voltage distributions are formed by writing 4-bit (4-page) data including the lower bit, middle bit, upper bit, and top bit. The sixteen threshold voltage distributions correspond to different respective 4-bit data. In the present embodiment, data is allocated to the memory cell transistors MT included in each state as "top bit/upper bit/middle bit/lower bit" as indicated below.

The memory cell transistor MT included in the "0" state stores "1111" data. The memory cell transistor MT included in the "1" state stores "1110" data. The memory cell transistor MT included in the "2" state stores "1010" data. The memory cell transistor MT included in the "3" state stores "1000" data. The memory cell transistor MT included in the "4" state stores "1001" data. The memory cell transistor MT included in the "5" state stores "0001" data. The memory cell transistor MT included in the "6" state stores "0000" data. The memory cell transistor MT included in the "7" state stores "0010" data. The memory cell transistor MT included in the "8" state stores "0110" data. The memory cell transistor MT included in the "9" state stores "0100" data. The memory cell transistor MT included in the "A" state stores "1100" data. The memory cell transistor MT included in the "B" state stores "1101" data. The memory cell transistor MT included in the "C" state stores "0101" data. The memory cell transistor MT included in the "D" state stores "0111" data. The memory cell transistor MT included in the "E" state stores "0011" data. The memory cell transistor MT included in the "F" state stores "1011" data.

1.3 Write Operation

Next, a write operation will be described. The write operation includes a program operation and a verification operation. By repeating a set of one program operation and one verification operation (hereinafter, "program loop"), the threshold voltage of the memory cell transistor MT is raised to a target state.

The program operation is an operation for raising the threshold voltage by accumulating electrons in the charge storage layer, or an operation for maintaining the threshold voltage by prohibiting further accumulation of electrons. In the following description, the operation for raising the threshold voltage will be called a "'0' program". For example, raising the threshold voltage of the memory cell transistor MT from "0" state to "1" state will be called a "0" program. The bit line BL of the "0" program target is supplied with a "0" program voltage (e.g., voltage VSS of a ground voltage) from the sense amplifier 140. On the other hand, the operation for maintaining the threshold voltage will be called a "'1' program" or "write inhibit", and the bit line BL of the "1" program target is supplied with a "1" program voltage (hereinafter, "voltage VBL") from the sense amplifier 140. In the following description, the bit line corresponding to the "0" program will be referred to as BL("0"), while the bit line corresponding to the "1" program will be referred to as BL("1").

The verification operation is an operation for reading data after the program operation and determining whether a threshold voltage of a memory cell transistor MT reaches a target state. In the following description, a case where the threshold voltage of the memory cell transistor MT reaches a target state will be referred to as "verification passed", while a case where it does not reach a target state will be referred to as "verification failed."

In the present embodiment, the write operation is executed in two stages. In the following description, a case where each memory cell transistor MT stores 4-bit data will be described. Of the write operation based on 4-page write data on a cell unit CU, the write operation executed for the first time will be referred to as a "first write operation", while the write operation executed for the second time will be referred to as a "second write operation." The write data for four pages is roughly written in the first write operation, and precisely written in the second write operation.

1.3.1 Change in Threshold Voltage Distribution

A description will be given of changes in threshold voltage distributions in the first write operation and the second write operation according to the present embodiment.

First, a change in the threshold voltage distribution of the memory cell transistor MT by the first write operation will be described with reference to FIG. 4.

Figure 4:
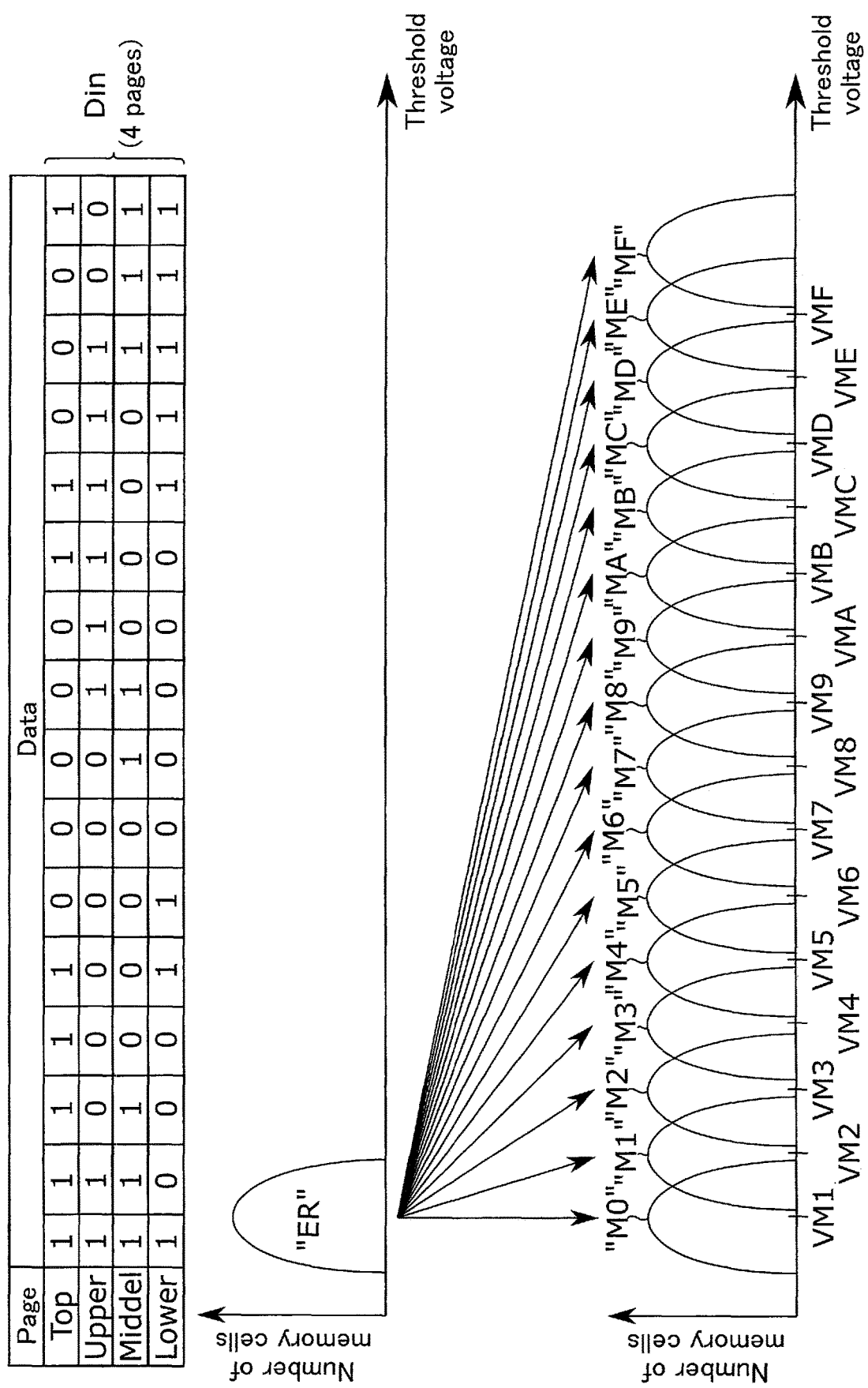
FIG. 4 is a schematic diagram for illustrating a change in a threshold voltage distribution in a first write operation of the memory cell transistors in the memory cell array in the embodiment.

As shown in FIG. 4, the sequencer 170 executes the first write operation based on the 4-page data input from the memory controller 200.

The threshold voltage of the memory cell transistor MT before the first write operation belongs to an "ER" state. The threshold voltage at the "ER" level is lower than voltage V1, corresponding to an erase state of the memory cell transistor MT.

The sequencer 170 in the first write operation uses voltages VM1, VM2, VM3, VM4, VM5, VM6, VM7, VM8, VM9, VMA, VMB, VMC, VMD, VME, and VMF, as a verification voltage. Voltages VM1, VM2, VM3, VM4, VM5, VM6, VM7, VM8, VM9, VMA, VMB, VMC, VMD, VME, and VMF are respectively used at the time of writing "1111" ("top bit/upper bit/middle bit/lower bit") data, "1110" data, "1010" data, "1000" data, "1001" data, "0001" data, "0000" data, "0010" data, "0110" data, "0100" data, "1100" data, "1101" data", "0101" data, "0111" data, "0011" data, and "1011" data. Voltage VM1 is lower than voltage V1. Voltage VM2 is lower than voltage V2. Voltage VM3 is lower than voltage V3. Voltages VM4 to VMF are lower than voltages V4 to VF, respectively.

When the first write operation is executed, the threshold voltage of the memory cell transistor MT rises based on data to be written, and sixteen threshold voltage distributions are formed. As shown in FIG. 4, each of the sixteen threshold voltage distributions formed by the first write operation may overlap the adjacent threshold voltage distribution. An "M0" state shown in FIG. 4 is formed by a plurality of memory cell transistors MT on which "1111" data is written. An "M1" state is formed by a plurality of memory cell transistors MT on which "1110" data is written. An "M2" state is formed by a plurality of memory cell transistors MT on which "1010" data is written. The same applies thereafter.

The threshold voltage belonging to the "M0" state is lower than voltage V1, and corresponds to an erase state of the memory cell transistor MT as the above-described "0" state and "ER" state. That is, in the memory cell transistors MT on which "1111" data is written in the first write operation, a rise of the threshold voltage is suppressed. However, in the "M0" state, although the threshold voltage does not change to the "1" state, the threshold voltage slightly rises by the first write operation. The threshold voltage belonging to the "M1" state is equal to or higher than voltage VM1 and lower than voltage V2. The threshold voltage belonging to the "M2" voltage is equal to or higher than voltage VM2 and lower than voltage V3. The same applies thereafter.

Thus, voltages VM1, VM2, VM3, VM4, VM5, VM6, VM7, VM8, VM9, VMA, VMB, VMC, VMD, VME, and VMF used for verification in the first write operation are set in such a manner that the threshold voltages of the memory cell transistors MT that have passed verification do not exceed voltages V2, V3, V4, V5, VG, V7, V8, V9, VA, VB, VC, VD, VE, VF, and VREAD.

Next, a change in the threshold voltage distribution of the memory cell transistor MT by the second write operation will be described with reference to FIG. 5.

Figure 5:
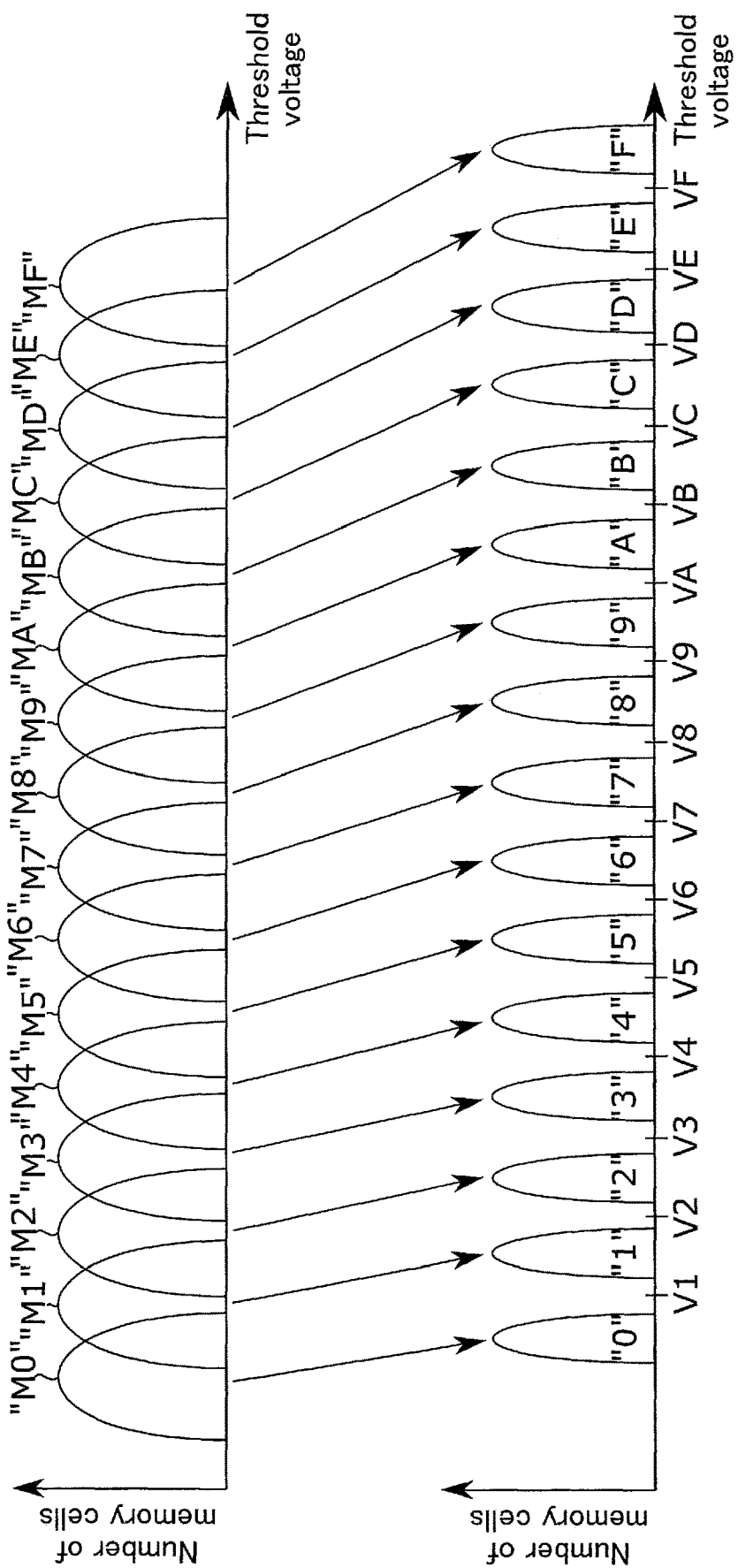
FIG. 5 is a schematic diagram for illustrating a change in a threshold voltage distribution in a second write operation of the memory cell transistors in the memory cell array in the embodiment.

As shown in FIG. 5, the sequencer 170 executes the second write operation based on the 4-page write data input from the memory controller 200.

In the second write operation, the sequencer 170 uses voltages V1, V2, V3, V4, V5, V6, V7, V8, V9, VA, VB, VC, VD, VE, and VF as a verification voltage. When the second write operation is executed, the threshold voltage of the memory cell transistor MT rises based on data to be written, and sixteen threshold voltage distributions with a narrower distribution width are respectively formed from sixteen threshold voltage distributions with a wider distribution width. For example, a "0" state threshold voltage distribution is formed from the "M0" state threshold voltage distribution, a "1" state threshold voltage distribution is formed from the "M1" state threshold voltage distribution, and a "2" state threshold voltage distribution is formed from the "M2" state threshold voltage distribution. The same applies thereafter.

1.3.2 Command Sequence

Figure 6:
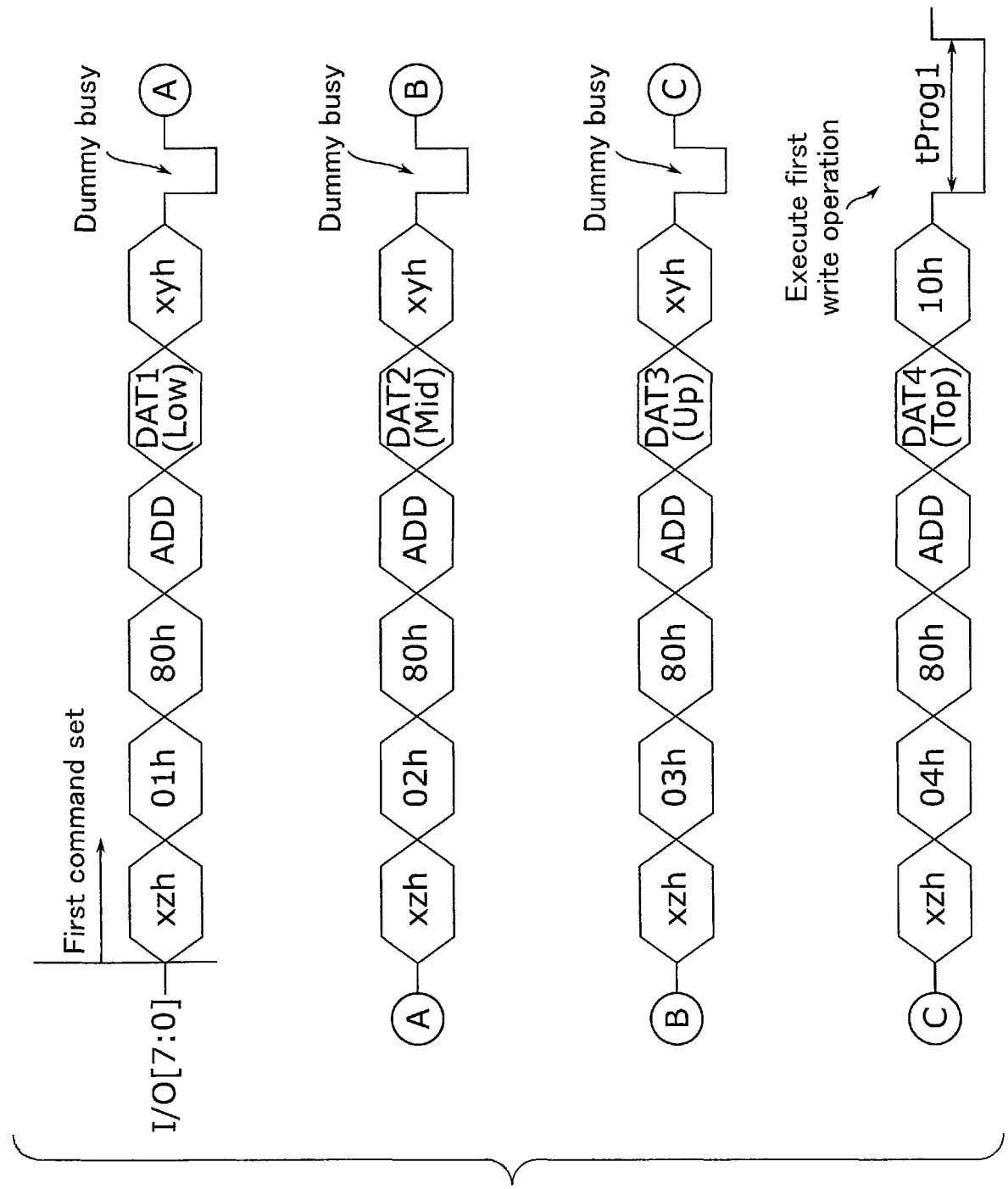
FIG. 6 is a command sequence for illustrating the first write operation of the memory system according to the embodiment.
Figure 7:
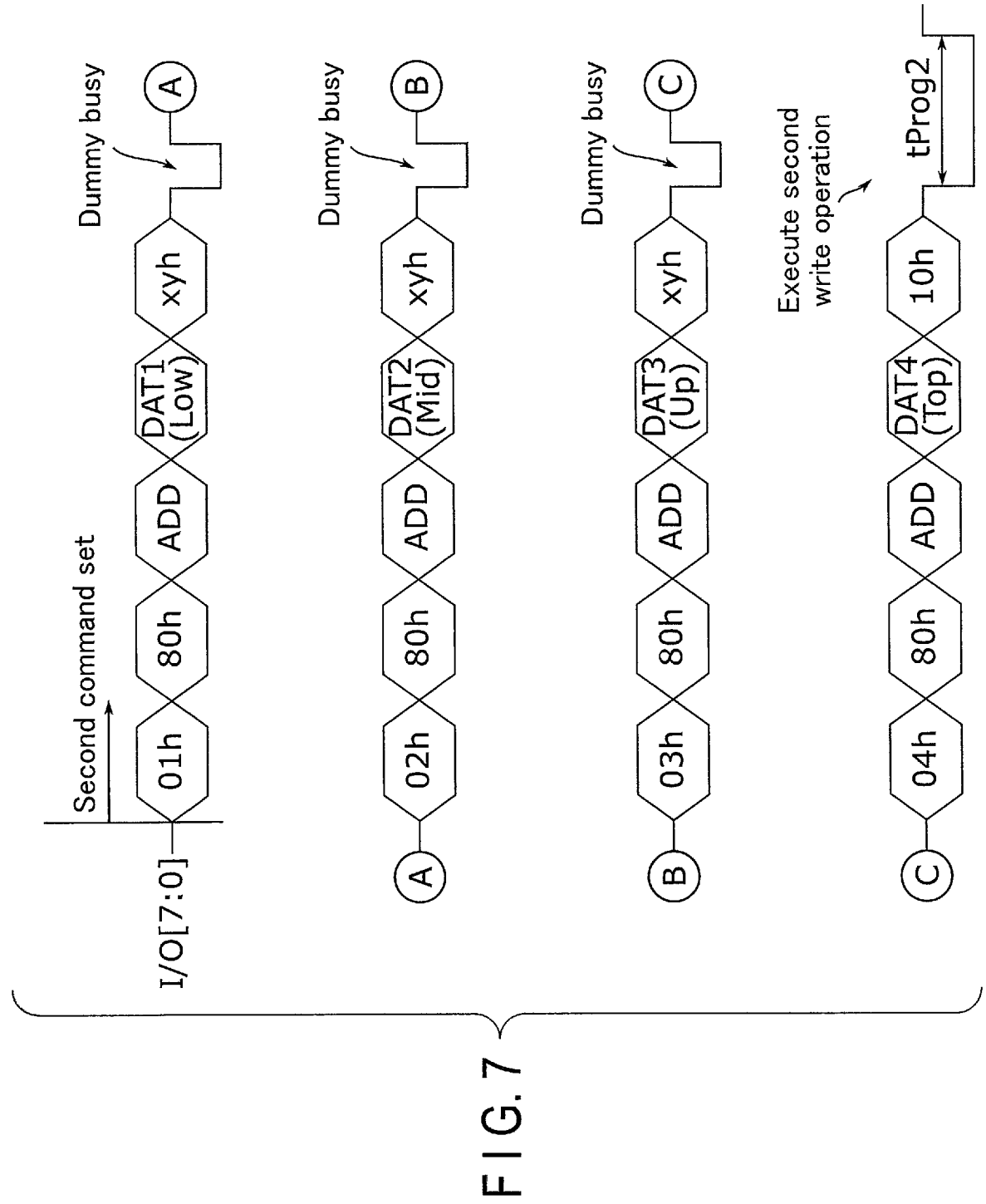
FIG. 7 is a command sequence for illustrating the second write operation of the memory system according to the embodiment.

Next, with reference to FIGS. 6 and 7, a description will be given of command sequences transmitted to the semiconductor memory device from the memory controller 200 in the write operation. FIGS. 6 and 7 show the command sequences in the first and second write operations, and show the input/output signal I/O input into the semiconductor memory device 100. It is assumed that the command CMD input into the semiconductor memory device 100 is stored in the command register 150, the address information ADD is stored in the address register 160, and the data DAT is stored in the first latch circuit (not shown) in the sense amplifier 140. In the following description, a set of commands corresponding to the first write operation will be referred to as a first command set, while a set of commands corresponding to the second write operation will be referred to as a second command set. In the present embodiment, immediately after the first command set including given address information ADD, the second command set including this address information ADD is not transmitted.

First, the command sequence in the first write operation will be described.

As shown in FIG. 6, first, the memory controller 200 transmits command "xzh" to the semiconductor memory device 100. The command "xzh" instructs the semiconductor memory device 100 to execute the first write operation.

Next, the memory controller 200 transmits command "01h" to the semiconductor memory device 100. The "command "01h" indicates that data DAT subsequently received is write data of the first page.

Next, the memory controller 200 transmits command "80h" to the semiconductor memory device 100. The command "80h" instructs the semiconductor memory device 100 to execute the write operation.

Next, the memory controller 200 transmits address information ADD and lower-page data DAT1 consecutively to the semiconductor memory device 100. The semiconductor memory device 100 stores the received address information ADD in the address register 160, and the received data DAT1 in the first latch circuit in the sense amplifier 140.

Next, the memory controller 200 transmits command "xyh" to the semiconductor memory device 100. When the command "xyh" is stored in the command register 150, the sequencer 170 sets the ready/busy signal RBn to a low ("L") level indicating a busy state, and causes the sense amplifier 140 to transfer data DAT1 stored in the first latch circuit to one of the second latch circuits. When the transfer of data DAT1 from the first latch circuit to the second latch circuit in the sense amplifier 140 is finished, the sequencer 170 sets the ready/busy signal RBn to the high ("H") level indicating a ready state. This operation corresponds to the portion denoted by "dummy busy" in FIG. 6.

Upon receipt of the "H" level ready/busy signal RBn, the memory controller 200 next transmits, to the semiconductor memory device 100, the command "xzh", command "02h", command "80h", address information ADD, middle-page data DAT2, and command "xyh" in order. The "command "02h" indicates that data DAT2 subsequently received is write data of the second page. When the command "xyh" is stored in the command register 150, the sequencer 170 sets the ready/busy signal RBn to the "L" level and causes the sense amplifier 140 to transfer data DAT2 stored in the first latch circuit to one of the second latch circuits different from that on which data DAT1 is stored. Thereafter, the sequencer 170 sets the ready/busy signal RBn to the "H" level.

Upon receipt of the "H" level ready/busy signal RBn, the memory controller 200 next transmits, to the semiconductor memory device 100, the command "xzh", command "03h", command "80h", address information ADD, upper-page data DAT3, and command "xyh" in order. When the command "xyh" is stored in the command register 150, during bringing the ready/busy signal RBn to the "H" level from the "L" level (during the dummy busy operation period), the sequencer 170 causes the sense amplifier 140 to transfer data DAT3 stored in the first latch circuit to one of the second latch circuits different from those on which data DAT1 and DAT2 are stored.

Upon receipt of the "H" level ready/busy signal RBn after dummy busy, the memory controller 200 next transmits, to the semiconductor memory device 100, the command "xzh", command "04h", command "80h", address information ADD, top-page data DAT4, and command "10h" in order.

When the command "10h" is stored in the command register 150, the sequencer 170 sets the ready/busy signal RBn to the "L" level and causes the sense amplifier 140 to transfer data DAT4 stored in the first latch circuit to one of the second latch circuits different from those on which data DAT1 to DAT3 are stored. Then, the sequencer 170 executes the first write operation based on data DAT1 to DAT4, and brings the ready/busy signal RBn to the "H" level after the first write operation is completed. In the following description, the period in which the first write operation is executed is called tProg1.

Next, the command sequence in the second write operation will be described.

As shown in FIG. 7, the command sequence in the second write operation is similar to that in the first write operation described with reference to FIG. 6, except that the command "xzh" provided first is excluded.

When the command "10h", which is the last command shown in FIG. 7, is stored in the command register 150, the sequencer 170 sets the ready/busy signal RBn to the "L" level, executes the second write operation, and sets the ready/busy signal RBn to the "H" level after the second write operation is completed. In the following description, the period in which the second write operation is executed is called tProg2.

1.3.3 Timing Chart

Next, the timing chart of voltages applied to various interconnects in the write operation will be described with reference to FIG. 8. FIG. 8 is a waveform showing the difference between the first write operation and the second write operation, and shows a timing chart of the voltage applied to the selected word line WL of the various interconnects in each write operation.

As shown in FIG. 8, after receipt of the first command set, in the first write period tProg1, the row decoder 120 first applies voltage VPGM1 to a selected word line WL, and applies voltage VPASS to non-selected word lines WL (not shown). Voltage VPASS is a voltage that sets the memory cell transistor MT to an ON state regardless of the threshold voltage of the memory cell transistor MT. Voltage VPGM1 is a voltage for being trapped electrons into a charge storage layer in the first write operation and is higher than voltage PASS. When voltage VPGM1 is applied to the selected word line WL, there is a rise in the threshold voltage of the "0" program target memory cell transistor MT coupled to the selected word line WL, whereas there is little rise in the threshold voltage of the "1" program target memory cell transistors MT coupled to the respective non-selected word lines WL to which voltage PASS is applied. Next, the row decoder 120 applies voltage Vvfy. Voltage Vvfy is a verification voltage, and is, for example, voltage VM1 shown in FIG. 4.

An operation for applying the above-described program voltage and verification voltage corresponds to a single program loop. Such a program loop is repeated by increasing the value of the program voltage by ΔVPGM1 each time. The value of voltage Vvfy applied at each program loop is changed to voltage VM2 or VM3, for example, as the first write operation proceeds. Multiple types of verification voltages may be used in the single program loop. When passing verification by voltage VMF, the sequencer 170 terminates the first write operation, and brings the ready/busy signal RBn to the "H" level.

Next, after receipt of the second command set, in the second write period tProg2, the row decoder 120 applies voltage VPGM2 to a selected word line WL, and applies voltage VPASS to non-selected word lines WL (not shown), in a manner similar to the first write period tProg1. Voltage VPGM2 is a voltage for being trapped electrons into a charge storage layer in the second write operation and is higher than voltage VPASS. Next, the row decoder 120 applies voltage Vvfy. For example, as voltage Vvfy, the row decoder 120 applies voltage V1 shown in FIG. 5 to a selected word line WL. Such a program loop is repeated by increasing the value of the program voltage by ΔVPGM2 each time until verification is passed.

The initial value of voltage VPGM2 is smaller than that of voltage VPGM1, and ΔVPGM2 is smaller than ΔVPGM1. The second write operation uses the program voltage and the voltage ΔVPGM smaller than those in the first write operation, and controls the threshold voltage of the memory cell transistor MT in detail. Therefore, the second write period tProg2 tends to be longer than the first write period tProg1.

1.3.4 Order of Executing Write Operation

Next, the order of executing the first and second write operations will be described with reference to FIG. 9.

FIG. 9 shows the order of selecting the string units SU and the word lines WL when data is consecutively written in blocks BLK0 and BLK1. The solid-line quadrangular frame, corresponding to the intersection of each word line WL and each string unit SU and divided into a upper and lower stages by the dash-line, indicates one cell unit CU, and the upper stage of the quadrangular frame indicates the second write operation (reference symbol "WRT2") while the lower stage thereof indicates the first write operation (reference symbol "WRT1").

As shown in FIG. 9, the sequencer 170 selects block BLK0 in the 1st to 60th operations, alternately selects blocks BLK1 and BLK0 in the 61st to 68th operations, and selects block BLK1 in the 69th and subsequent operations.

Specifically, for the 1st to 4th operations, the sequencer 170 executes the first write operation, in which word line WL0 of block BLK0 is selected and string units SU0 to SU3 are selected in order.

Next, for the 5th and 6th operations, the sequencer 170 selects string unit SU0 of block BLK0, and executes the first write operation in which word line WL1 of block BLK0 is selected, and the second write operation in which word line WL0 of block BLK0 is selected. In addition, for the 7th to 12th operations, the sequencer 170 selects string units SU1 to SU3 of block BLK0 in order, and alternately executes the first write operation in which word line WL1 of block BLK0 is selected, and the second write operation in which word line WL0 of block BLK0 is selected, in the same procedure as in the 5th and 6th operations.

Next, for the 13th to 20th operations, in a manner similar to that in the 5th to 12th operations, the sequencer 170 selects string units SU0 to SU3 of block BLK0 in order, and alternately executes the first write operation in which word line WL2 of block BLK0 is selected, and the second write operation in which word line WL1 of block BLK0 is selected.

Thereafter, in a similar manner, for (21+8k)th to (28+8k)th operations, the sequencer 170 selects string units SU0 to SU3 of block BLK0 in order, and alternately executes the first write operation in which word line WL (3+k) of block BLK0 is selected, and the second write operation in which word line WL (2+k) of block BLK0 is selected (0≤k≤4).

Next, for the 61st and 62nd operations, the sequencer 170 executes the first operation in which word line WL0 in string unit SU0 of block BLK1 is selected, and the second write operation in which word line WL7 in string unit SU0 of block BLK0 is selected. For the 63rd and 64th operations, the sequencer 170 executes the first operation in which word line WL0 in string unit SU1 of block BLK1 is selected, and the second write operation in which word line WL7 in string unit SU1 of block BLK0 is selected. For the 65th and 66th operations, the sequencer 170 executes the first operation in which word line WL0 in string unit SU2 of block BLK1 is selected, and the second write operation in which word line WL7 in string unit SU2 of block BLK0 is selected. For the 67th and 68th operations, the sequencer 170 executes the first operation in which word line WL0 in string unit SU3 of block BLK1 is selected, and the second write operation in which word line WL7 in string unit SU3 of block BLK0 is selected.

Next, for the 69th to 76th operations, the sequencer 170 selects string units SU0 to SU3 of block BLK1 in order, and alternately executes the first operation in which word line WL1 of block BLK1 is selected, and the second write operation in which word line WL0 of block BLK1 is selected.

In this manner, the sequencer 170 executes the first write operation in which word line WL0 of block BLK1 is selected before the second write operation in which word line WL7 of block BLK0 is selected is completed. That is, the sequencer 170 executes the write operation assuming that word line WL7 of block BLK0 and word line WL0 of block BLK1 are word lines WL adjacent to each other (e.g., having the same relationship as that between word lines WL3 and WL4 in the same block BLK). Thus, in the boundary of two blocks BLK, the regularity of the order of data writing does not change from the regularity in a block BLK.

Figure 10:
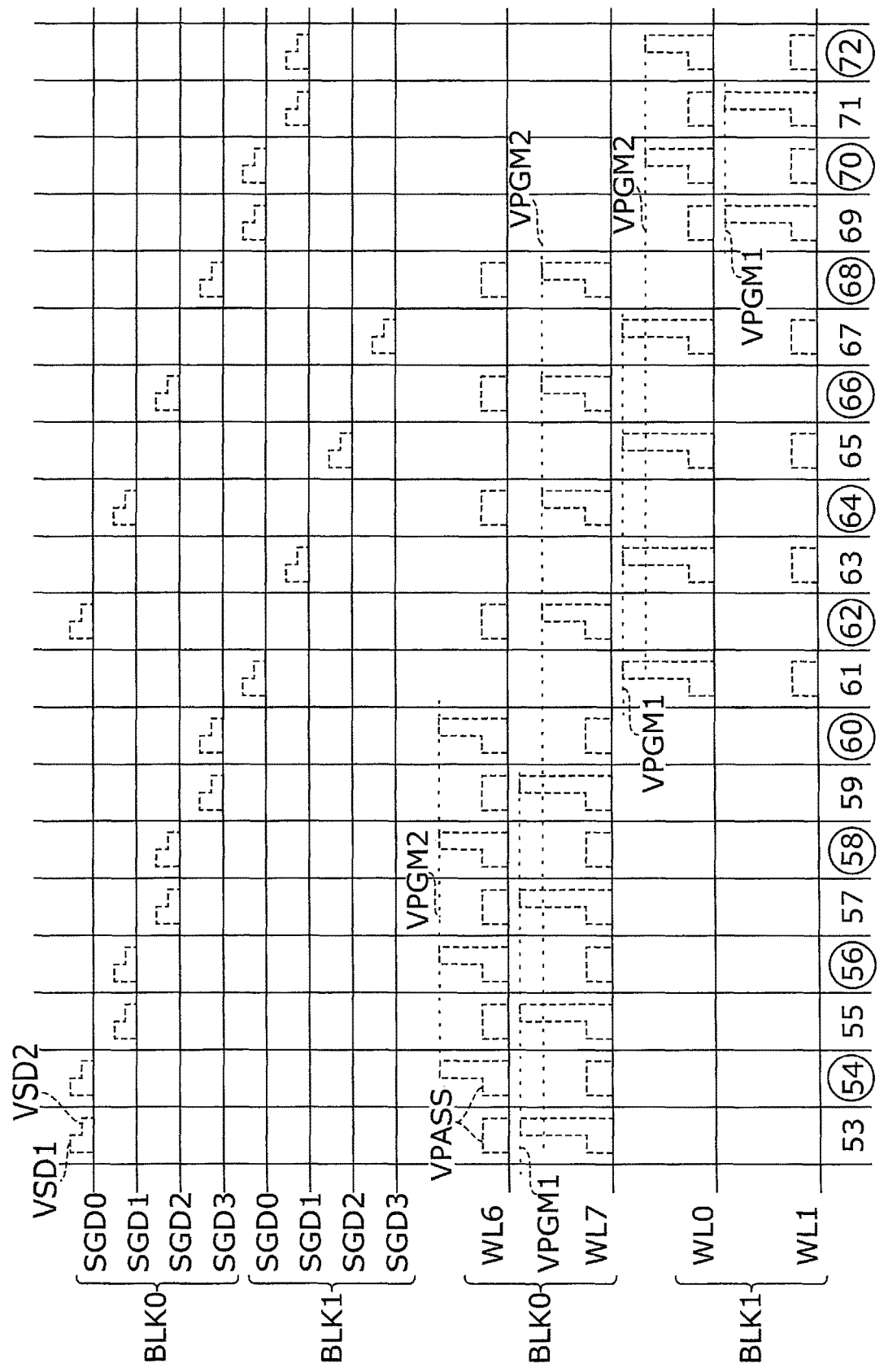
FIG. 10 is a timing chart for illustrating the order of executing the first write operation and the second write operation of the memory system according to the embodiment.

FIG. 10 schematically shows the order of data writing, and the voltages of corresponding select gate lines SGD and word lines WL. In FIG. 10, a waveform of each voltage is denoted by a dashed line.

In the 53rd to 72nd operations out of the data writing order shown in FIG. 9, FIG. 10 shows voltages applied to select gate lines SGD0 to SGD3, word lines WL6 and WL7 of block BLK0, and word lines WL0 and WL1 of block BLK1. In the example of FIG. 10, the waveform of the program operation in the first program loop of each write operation is schematically shown for simplification of explanation.

As shown in FIG. 10, in the 53rd and 54th write operations, in block BLK0, select gate line SGD0 (i.e., string unit SU0) is selected and word lines WL7 and WL6 are selected in order. More specifically, in the 53rd write operation (first write operation), in block BLK0, voltage VSD (VSD1 and VSD2) is applied to select gate line SGD0, voltage VPGM1 is applied to selected word line WL7, and voltage VPASS is applied to non-selected word line WL6. In the 54th write operation (second write operation), in block BLK0, voltage VSD is applied to selected word line SGD0, voltage VPGM2 is applied to selected word line WL6, and voltage VPASS is applied to non-selected word line WL7. In block BLK0, voltage VPASS is applied to non-selected word lines WL other than word lines WL6 and WL7.

Next, in the 55th to 60th operations, select gate lines SGD1 to SGD3 of block BLK0 are selected in order in the same procedure as in the 53rd and 54th operations. More specifically, in the 55th, 57th and 59th write operations (first write operation), in block BLK0, voltage VSD is applied to select gate lines SGD1, SGD2 and SGD3, respectively, voltage VPGM1 is applied to selected word line WL7, and voltage VPASS is applied to non-selected word line WL6. In the 56th, 58th and 60th write operations (second write operation), in block BLK0, voltage VSD is applied to selected word lines SGD1, SGD2 and SGD3, respectively, voltage VPGM2 is applied to selected word line WL6, and voltage VPASS is applied to non-selected word line WL7.

Next, in the 61st and 62nd write operations, a set of select gate line SGD0 and word line WL0 of block BLK1 and a set of select gate line SGD0 and word line WL7 of block BLK0 are selected, respectively, in order. More specifically, in the 61st write operation (first write operation), in block BLK1, voltage VSD is applied to select gate line SGD0, voltage VPGM1 is applied to selected word line WL0, and voltage VPASS is applied to non-selected word line WL1. In the 62nd write operation (second write operation), in block BLK0, voltage VSD is applied to select gate line SGD0, voltage VPGM2 is applied to selected word line WL7, and voltage VPASS is applied to non-selected word line WL6. In block BLK1, voltage VPASS is applied to non-selected word lines WL other than word lines WL0 and WL1.

Next, in the 63rd to 68th operations, in the same procedure as in the 61st and 62nd write operations, a set of select gate line SGD1 of block BLK1 and select gate line SGD1 of block BLK0 to a set of select gate line SGD3 of block BLK1 and select gate line SGD3 of block BLK0 are selected in order. More specifically, in the 63rd, 65th and 67th write operations (first write operation), in block BLK1, voltage VSD is applied to select gate lines SGD1, SGD2 and SGD3, respectively, voltage VPGM1 is applied to selected word line WL0, and voltage VPASS is applied to non-selected word line WL1. In the 64th, 66th and 68th write operations (second write operation), in block BLK0, voltage VSD is applied to selected word lines SGD1, SGD2 and SGD3, respectively, voltage VPGM2 is applied to selected word line WL7, and voltage VPASS is applied to non-selected word line WL6.

Next, in the 69th and 70th write operations, in block BLK1, select gate line SGD0 is selected, and word lines WL1 and WL0 are selected in order. More specifically, in the 69th write operation (first write operation), in block BLK1, voltage VSD is applied to select gate line SGD0, voltage VPGM1 is applied to selected word line WL1, and voltage VPASS is applied to non-selected word line WL0. In the 70th write operation (second write operation), in block BLK1, voltage VSD is applied to selected word line SGD0, voltage VPGM2 is applied to selected word line WL0, and voltage VPASS is applied to non-selected word line WL1.

Next, in the 71st and 72nd write operations, in block BLK1, select gate line SGD1 is selected, and word lines WL1 and WL0 are selected in order. More specifically, in the 71st write operation (first write operation), in block BLK1, voltage VSD is applied to select gate line SGD1, voltage VPGM1 is applied to selected word line WL1, and voltage VPASS is applied to non-selected word line WL0. In the 72nd write operation (second write operation), in block BLK1, voltage VSD is applied to selected word line SGD1, voltage VPGM2 is applied to selected word line WL0, and voltage VPASS is applied to non-selected word line WL1.

Because of the operations as described above, in the vicinity of the boundary between blocks BLK0 and BLK1, the second write operation is always executed every other time in consecutive write operations (specifically, in even-numbered write operations circled in FIG. 10). Therefore, ultimate data is written in a cell unit CU every other time (at a constant interval) in consecutive write operations.

If data is consecutively written in blocks BLK0 and BLK1, it is preferable that the erasure of unnecessary data written on block BLK1 in the past has been completed before a write operation on block BLK1 is started.

An erase operation on block BLK1 may be intermittently executed during execution of the write operation on block BLK0. The timing for commencement of the erase operation on block BLK1 may be set as appropriate, so that the erase operation on block BLK1 can be completed before the start of the write operation on block BLK1.

1.4 Advantageous Effect of Present Embodiment

The threshold voltage of the memory cell transistor MT after data is written may vary due to disturbance at the time of the write operation on the adjacent memory cell transistor MT or the write operation on other string unit SU. In particular, when 4-bit data is stored in a single memory cell transistor MT, it is required to generate a voltage so that sixteen threshold voltage distributions of the "0" level to the "F" level can be identified; thus, a margin between two states is small. Therefore, it is not possible to disregard the possibility that wrong data is written under the influence of disturbance described above.

According to the present embodiment, the memory controller 200 instructs the semiconductor memory device 100 to perform the write operation on a cell unit CU by dividing it into two operations of the first operation and the second write operation that follows the first write operation.

Specifically, the memory controller 200 instructs the semiconductor memory device 100 to, in the same block BLK, execute the first write operation on the memory cell transistor MT coupled to word line WLi, execute the first write operation on the memory controller MT coupled to word line WL(i+1), and then execute the second write operation on the memory cell transistor MT coupled to word line WLi. Thus, even when the memory cell transistor MT coupled to word line WLi is affected by disturbance, from the first write operation, upon the memory cell transistor MT coupled to the adjacent word line WL(i+1), data is precisely written by the subsequent second write operation; therefore, the influence of disturbance can be suppressed.

In addition, the memory controller 200 instructs the semiconductor memory device 100 to execute the first write operation on the cell unit CU corresponding to word line WL0 processed first in block BLK1 between the first write operation and the second write operation on the cell unit CU corresponding to word line WL7 processed last in block BLK0. Therefore, in the boundary between blocks BLK0 and BLK1, it is possible to suppress variations in intervals after data write on a given cell unit CU is completed until data write on a next cell unit CU is completed (latency of write operation).

This advantageous effect will be described in detail with the use of a comparative example. The comparative example corresponds to a case where a write operation (first write operation) on a cell unit CU in block BLK1 is started after a write operation (second write operation) on all cell units CU in block BLK0 is completed.

FIG. 11 is a conceptual diagram for illustrating an order of executing the first and second write operations of the memory system according to the comparative example, and corresponds to FIG. 9.

As shown in FIG. 11, specifically, the 1st to 60th operations are executed in the same order as that of the 1st to 60th operations in FIG. 9.

Next, for the 61st to 64th operations, the sequencer 170 executes the second write operation in which word line WL7 of block BLK0 is selected and string units SU0 to SU3 are selected in order. In this manner, a write operation on all cell units CU in block BLK0 is completed.

Next, for the 65th to 68th operations, the sequencer 170 executes the first write operation in which word line WL0 of block BLK1 is selected and string units SU0 to SU3 are selected in order.

Thereafter, the 69th to 76th operations are executed in the same order as the 69th to 76th operations in FIG. 9.

Thus, in the comparative example, the write operation for block BLK1 and the write operation for block BLK0 are executed separately without overlapping. Furthermore, in the comparative example, the second write operation is executed successively in the 60th to 64th write operations, and final (precise) data is continuously written on five cell units CU. On the other hand, the first write operation is executed successively in the 65th and 69th write operations, and temporal (rough) data is continuously written on five cell units CU. That is, in the comparative example, variations in latency of write operation may occur in the boundary between blocks BLK0 and BLK1.

The memory system 1 may be under a server constraint on variations in the latency of a write operation, such as SSD for a data center. Variations in latency caused in the boundary between blocks BLK0 and BLK1 as described in the comparative example likely fail to satisfy the above-described constraint, and are not preferable.

According to the present embodiment, as shown in FIG. 10, in the 61st to 68th write operations corresponding to the boundary between blocks BLK0 and BLK1, the first write operation on block BLK1 and the second write operation on block BLK0 are alternately executed. Thus, in the interval of completion of final data writing on the cell unit CU corresponding to word line WL7 of block BLK0, data is written on block BLK1. Thus, it is possible to execute the write operation on cell units CU corresponding to word line WL7 of block BLK0 and word line WL0 of block BLK1 with the same latency as other cell units CU. Therefore, variations in the latency of a write operation can be suppressed in the boundary between blocks BLK0 and BLK1.

2. Others

The above-described embodiments can be modified in various manners.

For example, in the above-described embodiments, the first operation is executed on the cell unit CU corresponding to string unit SU0 and word line WL0 in block BLK1, and immediately thereafter, the second write operation is executed on the cell unit CU corresponding to string unit SU0 and word line WL7 in block BLK0; however, the present invention is not limited to this example. That is, before the second write operation is executed on the cell unit CU corresponding to string unit SU0 and word line WL7 in block BLK0, the first write operation may be additionally executed on the cell unit CU corresponding to at least one of string units SU1 to SU3 and word line WL0 in block BLK1.

For a specific example, based on the selecting order shown in FIG. 9, the write operation may be executed in order of the first write operation (61st) corresponding to string unit SU0 and word line WL0 in block BLK1, the second write operation (60th) corresponding to string unit SU3 and word line WL6 in block BLK0, the first write operation (63rd) corresponding to string unit SU1 and word line WL0 in block BLK1, and the second write operation (62nd) corresponding to string unit SU0 and word line WL7 in block BLK0. Subsequently, the write operation may be executed in order of the first write operation (65th) corresponding to string unit SU2 and word line WL0 in block BLK1, and the second write operation (64th) corresponding to string unit SU1 and word line WL7 in block BLK0. Next, the write operation may be executed in order of the first write operation (67th) corresponding to string unit SU3 and word line WL0 in block BLK1, the second write operation (66th) corresponding to string unit SU2 and word line WL7 in block BLK0, the first write operation (69th) corresponding to string unit SU0 and word line WL1 in block BLK1, and the second write operation (68th) corresponding to string unit SU3 and word line WL7 in block BLK0.

For a further specific example, the write operation may be executed in order of the first write operation (61st) corresponding to string unit SU0 and word line WL0 in block BLK1, the first write operation (63rd) corresponding to string unit SU1 and word line WL0 in block BLK1, the first write operation (65th) corresponding to string unit SU2 and word line WL0 in block BLK1, and the first write operation (67th) corresponding to string unit SU3 and word line WL0 in block BLK1. Subsequently, the write operation may be executed in order of the second write operation (62nd) corresponding to string unit SU0 and word line WL7 in block BLK0, the second write operation (64th) corresponding to string SU1 and word line WL7 in block BLK0, the second write operation (66th) corresponding to string unit SU2 and word line WL7 in block BLK0, and the second write operation (68th) corresponding to string unit SU3 and word line WL7 in block BLK0.

Furthermore, in the above-described embodiment, four string units SU0 to SU3 corresponding to given word lines WL are always selected in this order, but the present invention is not limited to this example. For example, the selection order of string units SU0 to SU3 may differ for every word line WL.

In addition, in the above-described embodiment, the memory cell transistor MT stores 4-bit data, but the present invention is not limited to this example. For example, the memory cell transistor MT may store 1-bit to 3-bit or 5 or more-bit data.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory system comprising:
a semiconductor memory device including a first memory string and a second memory string each including a plurality of memory cell transistors electrically coupled in series; and
a memory controller configured to instruct the semiconductor memory device to execute a write operation for writing data on any one of the memory cell transistors in the first memory string or in the second memory string, wherein
the first memory string and the second memory string are electrically coupled in parallel between a bit line and a source line, and electrically coupled to different word lines,
the write operation includes a first write operation and a second write operation executed after the first write operation, and
the memory controller is configured to instruct the semiconductor memory device to execute the first write operation on a second memory cell transistor in the second memory string between the first write operation on a first memory cell transistor in the first memory string and the second write operation on the first memory cell transistor.

2. The memory system of claim 1, wherein
the first memory cell transistor is electrically coupled to a first word line,
the second memory cell transistor is electrically coupled to a second word line that is different from the first word line, and
in the write operation on the second memory string, the first write operation on the second memory cell transistor is firstly executed.

3. The memory system of claim 2, wherein
the semiconductor memory device further includes a third memory string and a fourth memory string electrically coupled in parallel between the bit line and the source line with the first memory string and the second memory string,
the third memory string includes a third memory cell transistor electrically coupled to the first word line,
the fourth memory string includes a fourth memory cell transistor electrically coupled to the second word line, and
the memory controller is configured to instruct the semiconductor memory device to execute the first write operation on the fourth memory cell transistor between the second write operation on the first memory cell transistor and the second write operation on the third memory cell transistor.

4. The memory system of claim 3, wherein
data stored in the second memory string and the fourth memory string are erased simultaneously by a first erase operation, and
data stored in the first memory string and the third memory string are erased simultaneously by a second erase operation different from the first erase operation.

5. The memory system of claim 2, wherein
the first memory string includes a third memory cell transistor electrically coupled to the first memory cell transistor in series, and
the memory controller is configured to instruct the semiconductor memory device to execute the first write operation on the first memory cell transistor between the first write operation on the third memory cell transistor and the second write operation on the third memory cell transistor.

6. The memory system of claim 2, wherein
the semiconductor memory device further includes a third memory string electrically coupled in parallel between the bit line and the source line with the first memory string and the second memory string,
the third memory string includes a third memory cell transistor electrically coupled to the second word line, and
the memory controller is configured to instruct the semiconductor memory device to execute the first write operation on the third memory cell transistor between the first write operation on the second memory cell transistor and the second write operation on the first memory cell transistor.

7. The memory system of claim 1, wherein the memory controller is configured to instruct the semiconductor memory device to complete a first erase operation on the second memory cell transistor before the first write operation on the second memory cell transistor.

8. The memory system of claim 7, wherein the first erase operation is different from a second erase operation on the first memory cell transistor.

9. A control method of a memory system including a semiconductor memory device, the semiconductor memory device including a first memory string and a second memory string each including a plurality of memory cell transistors electrically coupled in series,
the first memory string and the second memory string being electrically coupled in parallel between a bit line and a source line and electrically coupled to different word lines,
the method comprising, when the semiconductor memory device is instructed to execute a write operation for writing data on any one of the memory cell transistors in the first memory string or in the second memory string, the write operation including a first write operation and a second write operation executed after the first write operation, executing the first write operation on a second memory cell transistor in the second memory string between the first write operation on a first memory cell transistor in the first memory string and the second write operation on the first memory cell transistor.

10. The method of claim 9, wherein
the first memory cell transistor is electrically coupled to a first word line,
the second memory cell transistor is electrically coupled to a second word line that is different from the first word line, and
in the write operation on the second memory string, the first write operation on the second memory cell transistor is firstly executed.

11. The method of claim 10, wherein
the semiconductor memory device further includes a third memory string and a fourth memory string electrically coupled in parallel between the bit line and the source line with the first memory string and the second memory string,
the third memory string includes a third memory cell transistor electrically coupled to the first word line,
the fourth memory string includes a fourth memory cell transistor electrically coupled to the second word line, and
the method further comprises executing the first write operation on the fourth memory cell transistor between the second write operation on the first memory cell transistor and the second write operation on the third memory cell transistor.

12. The method of claim 11, wherein
data stored in the second memory string and the fourth memory string are erased simultaneously by a first erase operation, and
data stored in the first memory string and the third memory string are erased simultaneously by a second erase operation different from the first erase operation.

13. The method of claim 10, wherein
the first memory string includes a third memory cell transistor electrically coupled to the first memory cell transistor in series, and
the method further comprises executing the first write operation on the first memory cell transistor between the first write operation on the third memory cell transistor and the second write operation on the third memory cell transistor.

14. The method of claim 10, wherein
the semiconductor memory device further includes a third memory string electrically coupled in parallel between the bit line and the source line with the first memory string and the second memory string,
the third memory string includes a third memory cell transistor electrically coupled to the second word line, and
the method further comprises executing the first write operation on the third memory cell transistor between the first write operation on the second memory cell transistor and the second write operation on the first memory cell transistor.

15. The method of claim 9, further comprising completing a first erase operation on the second memory cell transistor before the first write operation on the second memory cell transistor.

16. The method of claim 15, wherein the first erase operation is different from a second erase operation on the first memory cell transistor.

* * * * *